(12) United States Patent
Miyashita (10) Patent No.: US 7,220,659 B2
(45) Date of Patent: May 22, 2007

(54) METHOD FOR MANUFACTURING A SEMICONDUCTOR DEVICE

(75) Inventor: Kazuyuki Miyashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/200,000

(22) Filed: Aug. 10, 2005

(65) Prior Publication Data
US 2006/0046416 A1 Mar. 2, 2006

(30) Foreign Application Priority Data
Aug. 27, 2004 (JP) ............................. 2004-248771

(51) Int. Cl.
*H01L 21/36* (2006.01)
(52) U.S. Cl. ................. 438/486; 438/149; 438/166
(58) Field of Classification Search ............. 438/166, 438/417, 486, 488
See application file for complete search history.

(56) References Cited

U.S. PATENT DOCUMENTS

2006/0155413 A1* 7/2006 Yamazaki et al. .......... 700/121

FOREIGN PATENT DOCUMENTS

| JP | A 03-289140 | 12/1991 |
|----|----|----|
| JP | A 06-342757 | 12/1994 |
| JP | A 2003-257992 | 9/2003 |

* cited by examiner

*Primary Examiner*—Dung A. Le
(74) *Attorney, Agent, or Firm*—Oliff & Berridge PLC (57) ABSTRACT

A method for manufacturing a semiconductor device includes: forming a semiconductor film on a substrate; performing dehydrogenation for removing hydrogen from the semiconductor film; performing inactivation by terminating a dangling bond of the semiconductor film with a supply of a molecule containing an impurity element to the semiconductor film at a concentration in accordance with a doping quantity; and crystallizing the semiconductor film while doping the impurity element contained in the molecule bonded to the dangling bond to the semiconductor film with a supply of energy to the inactivated semiconductor film, wherein the first to fourth steps are performed in an environment isolated from an atmosphere.

5 Claims, 6 Drawing Sheets

METHOD FOR MANUFACTURING A SEMICONDUCTOR DEVICE

This application claims the benefit of Japanese Patent Application No. 2004-248771, filed Aug. 27, 2004. The entire disclosure of the prior application is hereby incorporated by reference herein in its entirety.

BACKGROUND

The present invention relates to a method for manufacturing a semiconductor device, more specifically, a method for manufacturing a thin-film transistor.

The manufacturing process of a thin-film transistor serving as a semiconductor device includes, for example, forming a semiconductor film that is later to become a channel of the transistor, and crystallizing the semiconductor film by irradiating light (especially a laser beam). Such steps, which are performed in different manufacturing devices, involve the following problem. If a substrate is exposed to the atmosphere while the substrate is carried from one step to another, impurities in the atmosphere such as hydrocarbon, boron, phosphorus, water, etc. bond to the surface of the semiconductor film and, with the melting and solidification of the semiconductor film due to crystallization, a large quantity of impurity elements are mixed into the semiconductor film.

Conventionally, as a solution to the above problem, a technique wherein a thin amorphous semiconductor film is deposited and then a gate oxide film is formed by means of solid-phase growth with continuous heating of the thin amorphous semiconductor film without exposing it to the atmosphere has been proposed in a first related art example, which will be described later.

Further, for the purpose of preventing the mixing of impurity elements into a semiconductor film, another technique for carrying a specimen, avoiding exposure to the atmosphere, between a chamber for heating an amorphous semiconductor at a temperature lower than the crystallization temperature of the same semiconductor and another chamber for irradiating a laser beam to a semiconductor has been proposed in a second related art example, which will be described later.

In addition, a thin-film transistor manufactured based on the manufacturing process of a thin-film transistor involves, in some cases, a problem of the shift of flat-band voltage that depends on a fixed electric charge, etc. in a substrate protective film and a gate insulation film. As a solution to such a problem, a method for manufacturing a thin-film transistor that can control the variation in threshold voltage by doping boron, etc. to a channel region and fixing the flat-band voltage to 0 V, virtually, has been proposed in a third related art example, which will be described later.

As techniques that can prevent the mixing of impurity elements by avoiding exposure to the atmosphere and, at the same time, control the variation in flat-band voltage, two combinations of the above techniques can be considered, for example.

Figure 5A:
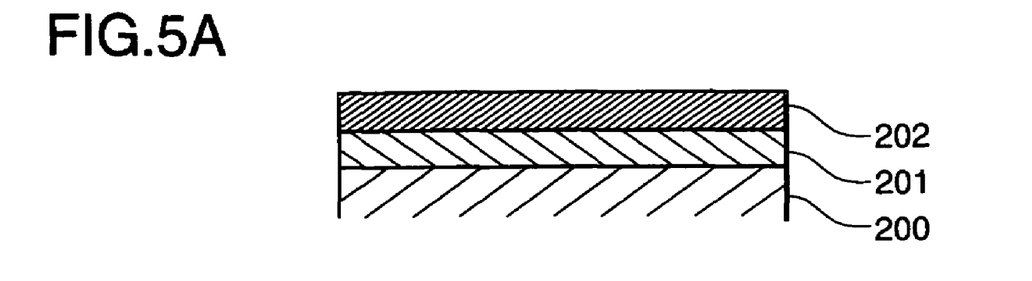
FIG. 5A to 5C are flow charts showing a first problem in a conventional technique.
Figure 5B:
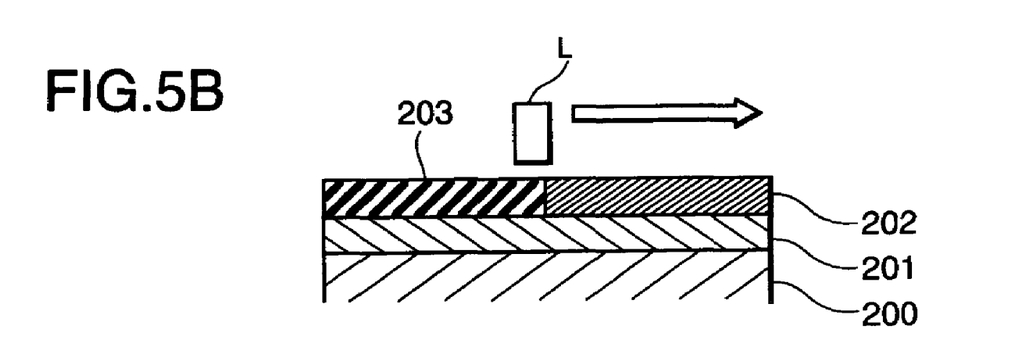
Figure 5C:
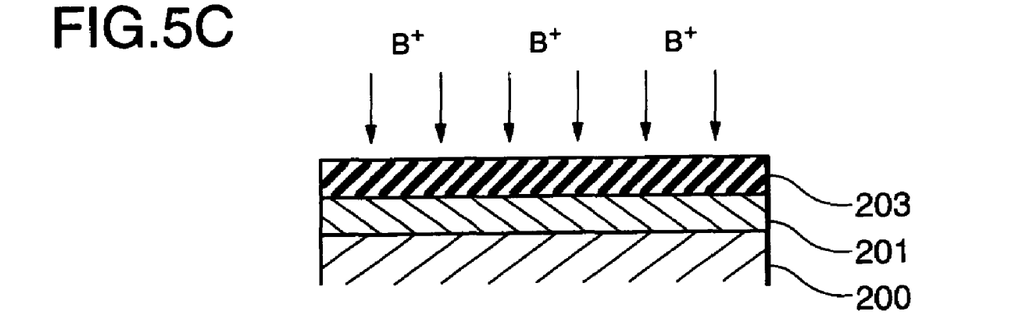

FIGS. 5A to 5C show a first combination wherein semiconductor film formation, laser crystallization, and impurity doping are performed in the described order. As shown in FIG. 5A, a semiconductor film 202 is formed on a substrate 200 through the intermediary of a substrate protective film 201 using a CVD device. Then, as shown in FIG. 5B, a crystallized semiconductor film 203 is formed by irradiating a laser beam using a laser crystallization device. Lastly, as shown in FIG. 5C, boron $B^+$ is doped on the crystallized semiconductor film 203 using a doping device.

Figure 6A:
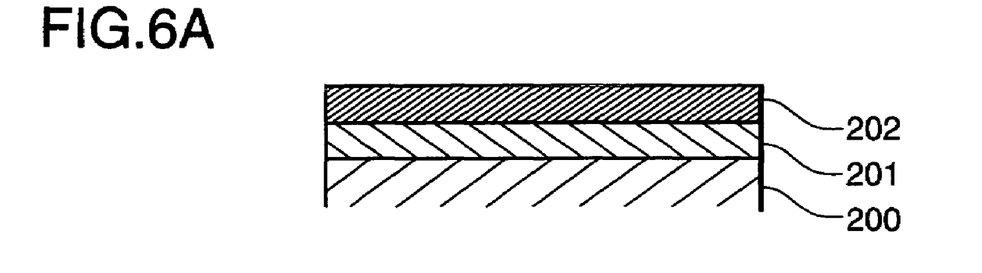
FIG. 6A to 6C are flow charts showing a second problem in a conventional technique.
Figure 6B:
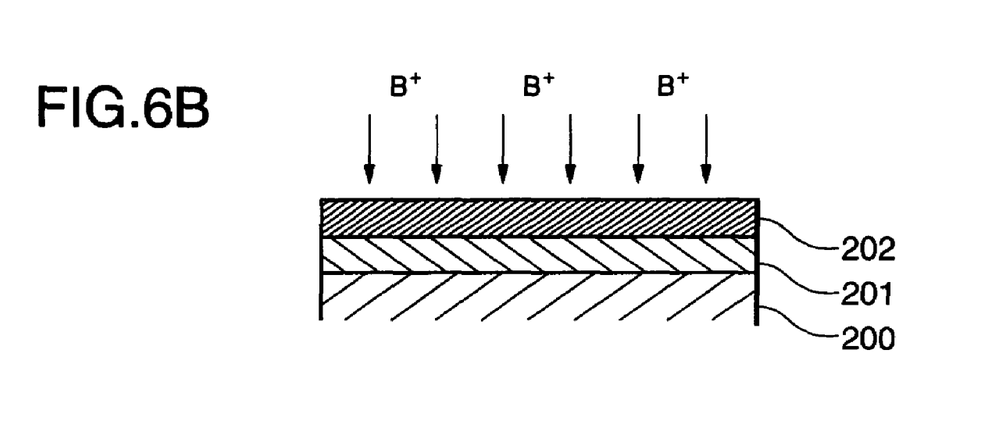
Figure 6C:
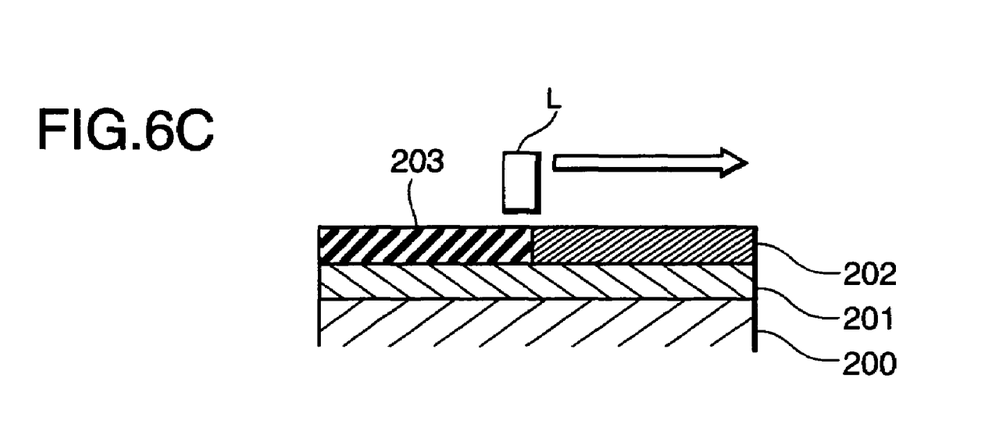

FIGS. 6A to 6C show a second combination wherein semiconductor film formation, impurity doping, and laser crystallization are performed in the described order. As shown in FIG. 6A, a semiconductor film 202 is formed using a CVD device. Then, as shown in FIG. 6B, boron $B^+$ is doped on the semiconductor film 202 using a doping device. Lastly, as shown in FIG. 6C, the semiconductor film 202 is crystallized by irradiating a laser beam.

In the first combination, a heating process for activating the doped impurities is required separately. However, since the highest annealing temperature of a glass substrate is limited, the above process is replaced by the increase of the doping quantity. On the other hand, when the doping quantity is increased, the properties of a semiconductor film may be degraded. Hence, the second combination, which can achieve a highly efficient activation of impurities in the laser crystallization step, is superior to the first combination.

Japanese Unexamined Patent Publication No. 3-289140 is a first example of related art.

Japanese Unexamined Patent Publication No. 6-342757 is a second example of related art.

Japanese Unexamined Patent Publication No. 2003-257992 is a third example of related art.

In both the first and second combinations, however, all of the CVD device, doping device, and laser crystallization device need to be used in combination in order to achieve the purpose of preventing the mixing of impurity elements by avoiding exposure to the atmosphere and, at the same time, controlling the variation in flat-band voltage.

The more the number of manufacturing devices increases, the more the number of steps required for carrying a substrate to another manufacturing device increases, which leads to a cost increase. Especially, the three manufacturing devices need to be coupled with one another under an airtight state so as not to expose a substrate to the atmosphere, which makes the cost increase of manufacturing devices unavoidable.

SUMMARY

An advantage of the invention is to provide a low-cost and easy method for manufacturing a semiconductor device that can prevent the mixing of impurity elements by avoiding exposure to the atmosphere from the step for forming a semiconductor film to the step for crystallizing a semiconductor film and, at the same time, control the variation in flat-band voltage.

According to a first aspect of the invention, a method for manufacturing a semiconductor device includes: forming a semiconductor film on a substrate; performing dehydrogenation for removing hydrogen from the semiconductor film; performing inactivation by terminating a dangling bond of the semiconductor film with the supply of a molecule containing an impurity element to the semiconductor film at a concentration in accordance with a doping quantity; and crystallizing the semiconductor film while doping the impurity element contained in the molecule bonded to the dangling bond onto the semiconductor film with the supply of energy to the inactivated semiconductor film. The first to fourth steps are performed in an environment isolated from the atmosphere.

With the above processing, since the impurity element that terminates the dangling bond on the surface of a semiconductor is doped into the semiconductor film by performing laser crystallization after inactivating the semiconductor film that is once activated with a specific quantity of impurity elements following the formation of the semiconductor film, at least the need of using a doping device is eliminated and therefore a semiconductor device can be manufactured at a low cost and with ease. Further, the successive performance from semiconductor film formation to laser crystallization without exposure to the atmosphere makes it possible to prevent the mixing of impurities, such as hydrocarbon, water, etc. included in the atmosphere, into the semiconductor film, except the impurities required for controlling flat-band voltage.

In the above case, it is preferable that the third step is for terminating the dangling bond of the semiconductor film by supplying a gas, which is made by diluting the molecule with hydrogen, to the semiconductor film activated by the dehydrogenation. With such a configuration, since a hydrogen gas that contains a specific rate of molecules containing impurity elements is supplied, the dangling bond of an activated semiconductor film is easily terminated and molecules containing impurity elements come to exist on the surface of the semiconductor film in accordance with the rate of the same molecules in the gas. Further, hydrogen is preferable as an element used for inactivation because hydrogen is not mixed into a semiconductor.

For example, it is preferable that the third step is performed in an atmosphere that contains diborane ($B_2H_6$) as a molecule containing the impurity element and that the diborane is diluted at a rate of 1/100 or less. By diluting diborane with other gas molecules, hydrogen for example, at a ratio of 1 to 100 or more for hydrogen, the adsorption of excessive impurities to the surface of a semiconductor film can be prevented and, at the same time, the doping quantity can be controlled appropriately.

According to a second aspect of the invention, another method for manufacturing a semiconductor device includes: forming a semiconductor film on a substrate; performing dehydrogenation for removing hydrogen from the semiconductor film; performing inactivation by terminating a dangling bond of the semiconductor film; and performing crystallization by irradiating energy to the inactivated semiconductor film. The first to fourth steps are performed in an environment isolated from the atmosphere and, at the time of the energy irradiation, the semiconductor film is crystallized while an impurity element is doped to the semiconductor film.

With the above processing, a semiconductor film that is activated after being formed is inactivated and then molecules containing impurity elements are supplied during laser irradiation. Since the crystallization of a semiconductor film and the doping into the semiconductor film are performed in parallel, at least the need of using a doping device is eliminated and therefore a semiconductor device can be manufactured at a low cost and with ease.

In the above case, it is preferable that a molecule containing the impurity element is supplied in the fourth step and that the quantity of the supply is determined based on: the adsorption rate of the impurity element when the surface of the semiconductor film is activated; the time of supplying the energy; the quantity of collision of the impurity element per unit time; and the quantity of the impurity element that is adsorbed before supplying the energy. Since there is a specific relation among the above factors in the laser crystallization of a semiconductor film, the doping quantity can be controlled appropriately by supplying molecules containing impurity elements based on the above factors.

Further, in the first and second aspects of the invention, it is preferable that the third step is for exposing the surface of the semiconductor film to the atmosphere containing hydrogen plasma or hydrogen. With the above processing, the dangling bond on the surface of a semiconductor film can be terminated and inactivated effectively.

BRIEF DESCRIPTION OF THE DRAWINGS

The invention will be described with reference to the accompanying drawings, wherein like numbers refer to like elements, and wherein.

DETAILED DESCRIPTION OF EMBODIMENTS

In the invention, activation is completed by introducing impurity elements into a polycrystallized polysilicon layer using either of: a method (the first aspect of the invention) wherein impurities (boron, etc., for example, as an acceptor impurity) are adsorbed on the surface of a semiconductor film prior to laser crystallization and then laser crystallization is performed; or another method (the second aspect of the invention) wherein laser crystallization is performed while impurities are supplied during laser irradiation. The first aspect will be described in a first embodiment, and the second aspect will be described in a second embodiment.

(First Embodiment)

FIGS. 1A to 1D show a cross section of the manufacturing process of a method for manufacturing a semiconductor device according to the first embodiment of the invention. The first embodiment, which relates to the first aspect of the invention, includes: a first step (FIG. 1A) for forming a semiconductor film on a substrate; a second step (FIG. 1B) for performing dehydrogenation for removing hydrogen from the semiconductor film; a third step (FIG. 1C) for performing inactivation by terminating a dangling bond of the semiconductor film with the supply of a molecule containing an impurity element to the semiconductor film at a concentration in accordance with the doping quantity; and a fourth step (FIG. 1D) for crystallizing the semiconductor film while doping the impurity element contained in the molecule bonded to the dangling bond onto the semiconductor film with the supply of energy to the inactivated semiconductor film. The above steps are performed in succession in an environment isolated from the atmosphere. Now the first embodiment will be described in detail.

Figure 1A:
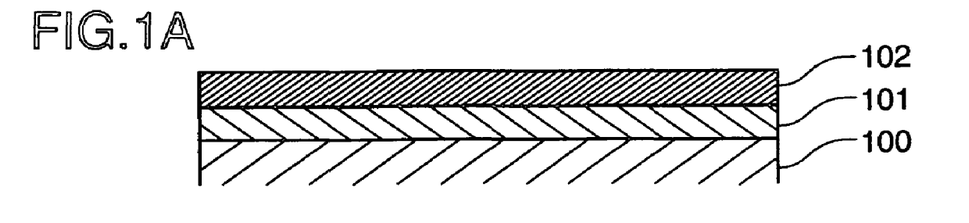
FIGS. 1A to 1D are flow charts showing the manufacturing process of a semiconductor film according to a first embodiment (first example) of the invention.

As shown in FIG. 1A, a substrate protective film 101, which is an insulative material, is formed on a substrate 100 (glass substrate, for example) for forming a thin-film semiconductor device. Further on the substrate protective film 101, a semiconductor film 102, which is made of an intrinsic silicon film, etc. and to become an active layer of a thin-film transistor serving as a semiconductor device, is formed in the first step. The films are formed using a CVD device.

In addition, if the surface of the semiconductor film 102 is exposed to the atmosphere, a great quantity of hydrocarbon, water, etc. are adsorbed. In order to prevent such adsorption, the steps performed after the formation of a semiconductor film are performed in an airtight atmosphere.

Figure 1B:
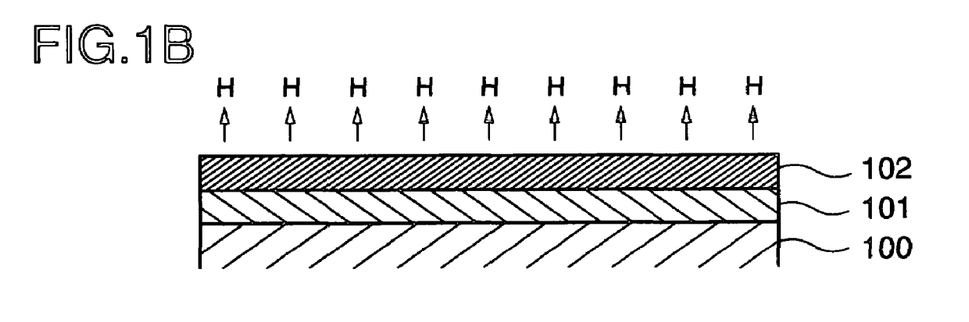

As shown in FIG. 1B, dehydrogenation for releasing a great quantity of hydrogen existing on and within the semiconductor film 102 is performed in the second step. The second step is performed after carrying the substrate 100 into a dehydrogenation chamber. On the surface of an amorphous silicon layer immediately after being formed, many of the dangling bonds (unpaired dangling bonds) of silicon atoms are configured of a hydrogen element and a silicon element that are bonded with each other. The semiconductor film 102 also includes a number of hydrogen atoms inside. By performing dehydrogenation under the above state, the hydrogen atoms on the semiconductor film 102 are removed and the surface of the semiconductor film 102 is activated. Under such an activated state, impurity elements such as hydrocarbon, water, phosphorus, boron, etc. contained in the atmosphere are easy to be adsorbed.

If it is attempted to adsorb impurities, such as boron, etc. as an acceptor impurity for example, under the above state prior to laser crystallization so as to stabilize the flat-band voltage, an extremely large quantity of impurity elements are adsorbed on the surface of the semiconductor film. If laser crystallization is performed under a state where a large quantity of impurity elements are adsorbed, the large quantity of impurity elements are diffused within the polysilicon semiconductor film under an uncontrollable state, which badly affects the electric properties of the thin-film transistor.

For example, the dose quantity of boron required for adjusting the flat-band voltage to virtually 0 V ranges from approximately $1 \times 10^{16}$ cm$^{-3}$ to $3 \times 10^{16}$ cm$^{-3}$. Assuming the film thickness of a polycrystalline silicon layer as approximately 50 nm, the quantity of boron only needs to be controlled so that boron is adsorbed at a concentration of $1 \times 10^{11}$ cm$^{-2}$, which is the maximum allowable quantity.

Therefore in the first aspect of the invention, as described below, the dangling bond on the surface of the semiconductor film is terminated in an atmosphere wherein molecules containing impurity elements are diluted with an inactivated gas so as to obtain an appropriate doping quantity. Thus, impurity elements are adsorbed to the surface of the semiconductor film 102 at a required concentration and the rest of the impurity elements are subjected to inactivation. That is, inactivation can be achieved simultaneously with the adsorption of an appropriate quantity of impurity elements that are doped in laser crystallization in the same step. As an inactivated gas, hydrogen is preferable, for example. Since hydrogen is not taken into a semiconductor film, hydrogen is preferable as a gas for inactivation, or a dilution gas of impurity elements. Further, hydrogen plasma can also be used instead of hydrogen gas.

Figure 1C:
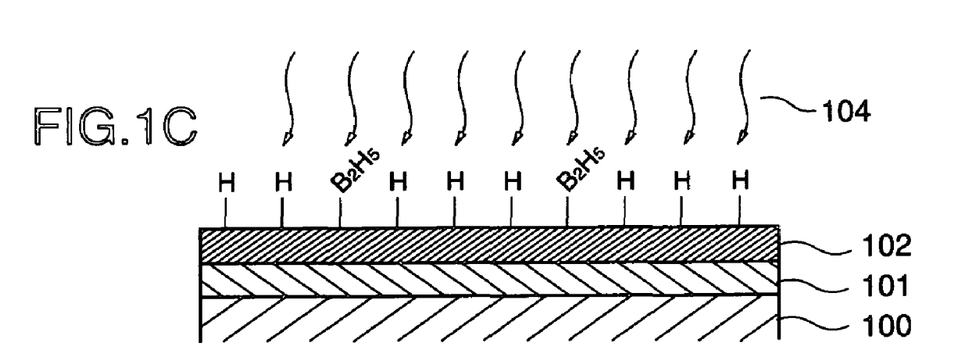

As shown in FIG. 1C, the quantity of boron to be adsorbed to the surface of the semiconductor film 102 is controlled in the third step using, for example, a diborane gas 104 made by diluting molecules (diborane $B_2H_6$, for example) containing boron with a large quantity of hydrogen gas. When diborane is used, the dilution ratio of diborane to hydrogen must be 1 to 100 or more for hydrogen. Since the dilution ratio also depends on the time duration for supplying diborane gas, the time duration for supplying diborane gas must be controlled. Specifically, the dilution ratio is determined in accordance with the structure of molecules containing impurity elements and the supply duration. With the supply of the diborane gas 104, the dangling bond on the activated surface of the semiconductor film 102 is terminated with diborane, and the rest of the surface region is subjected to inactivation with hydrogen.

Figure 1D:
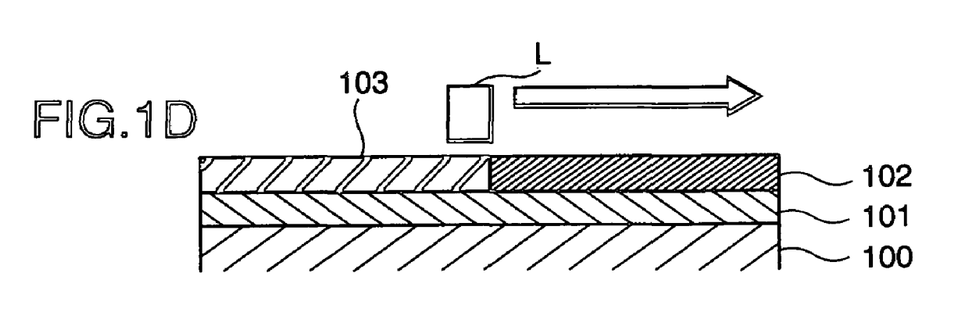

As shown in FIG. 1D, after the dangling bond is terminated and an appropriate quantity of diborane is adsorbed, the substrate 100 is carried to a laser irradiation chamber. Then, the silicon surface is crystallized by performing laser irradiation L. In addition, diborane gas can be supplied continuously during laser irradiation. In the laser irradiation L, the semiconductor film 102 that is in an amorphous state is entirely polycrystallized by, for example, irradiating a laser pulse of a specific intensity at specific intervals while changing the relative positions of the laser beam and the substrate 100.

With the above laser crystallization step, the impurity elements adsorbed to the surface of the semiconductor film 102 at a specific concentration are taken into the polycrystallized semiconductor film 103 and activated by the laser.

Thus, with the first embodiment, it has become possible to provide a low-cost and easy method for manufacturing a semiconductor device that can prevent the mixing of impurity elements by avoiding exposure to the atmosphere and, at the same time, control the variation in flat-band voltage.

Especially, with the first aspect of the invention, it has become possible to manufacture a semiconductor device without using manufacturing devices such as a doping device, etc.

(Second Embodiment)

FIGS. 2A to 2E show a cross section of the manufacturing process of a method for manufacturing a semiconductor device according to the second embodiment of the invention. The second embodiment, which relates to the second aspect of the invention, includes: a first step (FIG. 2A) for forming a semiconductor film on a substrate; a second step (FIG. 2A) for performing dehydrogenation for removing hydrogen from the semiconductor film; a third step (FIG. 2B) for performing inactivation by terminating a dangling bond of the semiconductor film activated by dehydrogenation; and a fourth step (FIGS. 2C to E) for supplying energy to the inactivated semiconductor film. In the above steps, the semiconductor film is crystallized by supplying molecules containing impurity elements during energy irradiation while doping the impurity elements in the molecules onto the semiconductor film. Further, each of the above steps are performed in succession in an environment isolated from the atmosphere. Now the second embodiment will be described in detail.

Figure 2A:
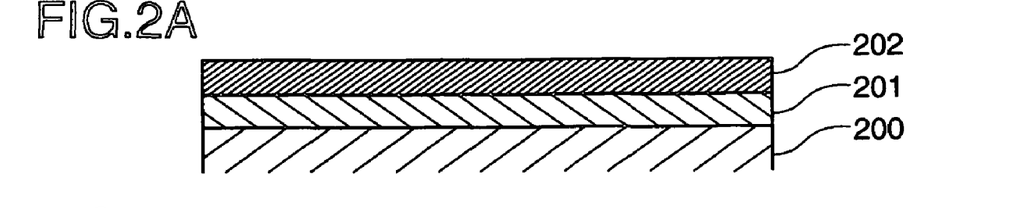
FIGS. 2A to 2E are flow charts showing the manufacturing process of a semiconductor film according to a second embodiment (second example) of the invention.

As shown in FIG. 2A, a substrate protective film 201, which is an insulative material, is formed on a substrate 200 (glass substrate, for example) for forming a thin-film semiconductor device. Further on the substrate protective film 201, a semiconductor film 202, which is made of an intrinsic silicon film, etc. and to become an active layer of a thin-film transistor serving as a semiconductor device, is formed in the first step. The films are formed using a CVD device.

In addition, if the surface of the semiconductor film 202 is exposed to the atmosphere, a great quantity of hydrocarbon, water, etc. are adsorbed. In order to prevent such adsorption, the steps performed after the formation of a semiconductor film are performed in an airtight atmosphere.

As shown in FIG. 2A, dehydrogenation for releasing a great quantity of hydrogen existing on and within the semiconductor film 202 is performed in the second step. The second step is performed after carrying the substrate 200 into a dehydrogenation chamber. On the surface of an amorphous silicon layer immediately after being formed, many of the dangling bonds of silicon atoms are configured of a hydrogen element and a silicon element that are bonded with each other. The semiconductor film 202 also includes a number of hydrogen atoms inside. By performing dehydrogenation under the above state, the hydrogen atoms on the semiconductor film 202 are removed and the surface of the semiconductor film 202 is activated. Under such an activated state, impurity elements such as hydrocarbon, water, phosphorus, boron, etc. contained in the atmosphere are easy to be adsorbed.

If it is attempted to adsorb impurities, such as boron, etc. as an acceptor impurity for example, under the above activated state prior to laser crystallization so as to stabilize the flat-band voltage, an extremely large quantity of impurity elements are adsorbed to the surface of the semiconductor film. If laser crystallization is performed under such a state, the impurity elements are diffused within the polysilicon semiconductor film under a quantitatively uncontrollable state, which badly affects the electric properties of the thin-film transistor.

Figure 2B:
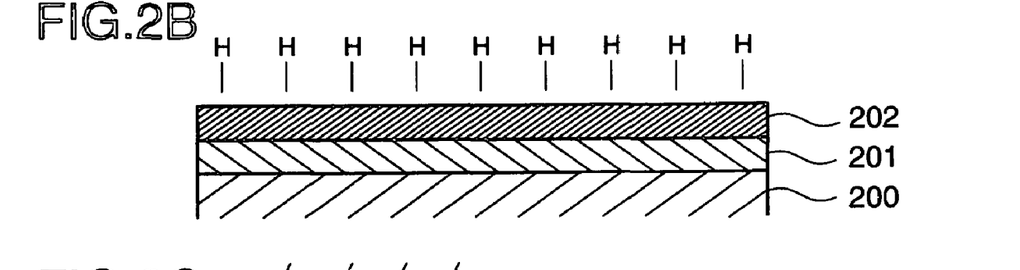

Therefore in the second aspect of the invention, the inactivation of the surface of the activated semiconductor film 202 is performed first, which is the difference from the first embodiment wherein inactivation is performed after diluting a specific quantity of impurity elements at a controlled dilution rate. Since hydrogen is not taken into a semiconductor film, hydrogen is preferable as a gas for inactivation. Further, the inactivation of the surface of the semiconductor film 202 can also be performed by supplying hydrogen plasma. That is, as shown in FIG. 2B, the dangling bond on the silicon surface is terminated in the third step by exposing the surface of the semiconductor film to an atmosphere containing hydrogen gas or hydrogen plasma.

Figure 2C:
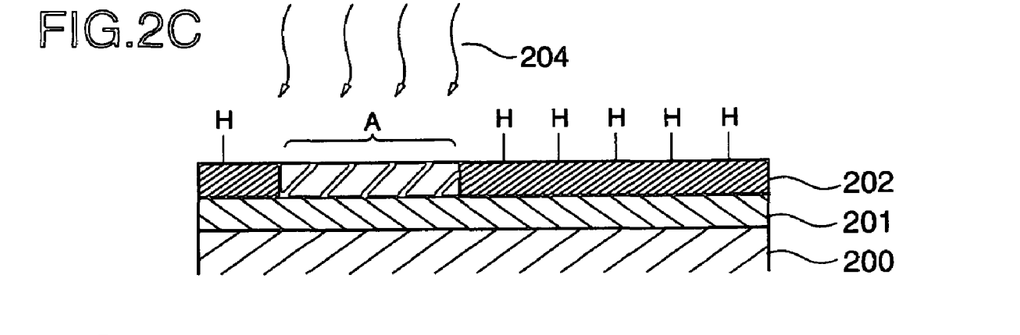
Figure 2D:
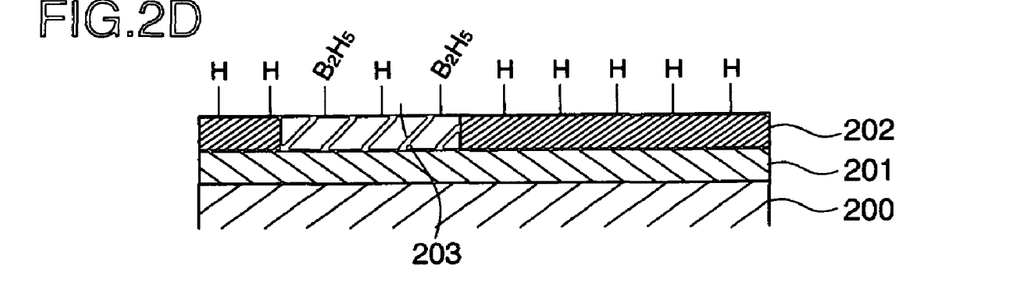
Figure 2E:
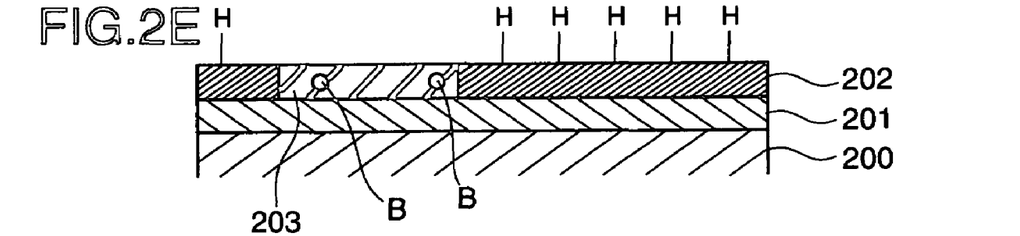

Next, as shown in FIGS. 2C to E, the substrate 200 is carried to a laser irradiation chamber. Then, by supplying molecules containing impurity elements during laser irradiation L, the semiconductor film 202 is polycrystallized and, at the same time, the impurity elements are introduced into the polycrystal to complete activation by laser irradiation.

The laser crystallization technique is generally for polycrystallizing semiconductors by irradiating a pulsed laser several dozens of times per region for the purpose of improving the crystallinity of semiconductors. According to an experiment performed by the applicant, it has been found that when a laser is irradiated on the surface of amorphous silicon that is inactivated with the termination of a dangling bond using hydrogen, the surface is reactivated. The silicon surface is activated in the first laser irradiation. Therefore, if there is any impurity element on the silicon surface at the time of the second laser irradiation, the impurity is adsorbed on the silicon surface. Further, the impurity is introduced into the silicon surface by the subsequent laser irradiation, which promotes activation at the same time. In order to obtain such a result, it is only necessary to control the quantity of molecules containing impurity elements that are supplied at the time of intermittent irradiation of a pulsed laser.

Therefore in the second aspect of the invention, as described below, the semiconductor film 202 is crystallized by supplying molecules containing impurity elements while doping the impurity elements contained in the molecules onto the semiconductor film 202 at the time of laser irradiation.

As shown in FIG. 2C, when the first laser pulse L is irradiated, the irradiated region is activated (polycrystallized), which is a state where the elements of the semiconductor film 202, such as dangling bonds of silicon for example, are generated and therefore impurity elements and hydrogen are easy to be adsorbed. Inside the chamber, a diluted gas 204 that is diluted with molecules (hydrogen, for example) for inactivating the molecules (diborane, for example) containing impurity elements is supplied.

As shown in FIG. 2D, since there is the diluted gas 204 around the irradiated region A that is activated as above, the dangling bond of the irradiated region A is terminated by diborane molecules and hydrogen molecules. The concentration of diborane corresponds to the diborane dilution rate of the diluted gas 204.

As shown in FIG. 2E, when the laser pulse L is continuously irradiated to the point where the irradiated region A is terminated by diborane and hydrogen, impurity elements are taken into the polycrystallized semiconductor film 203 and further the activation of the impurity elements themselves is promoted.

Figure 3:
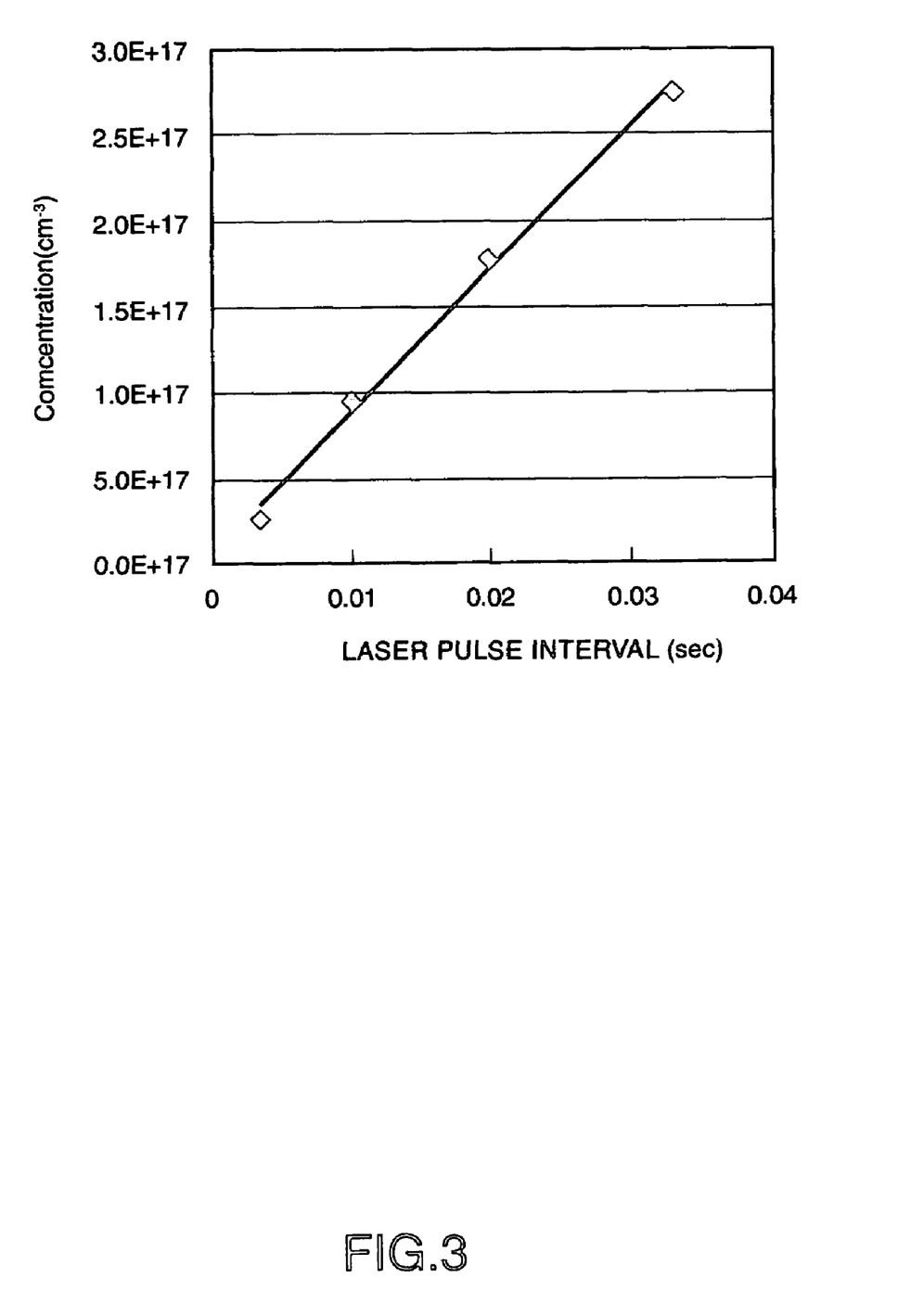
FIG. 3 is a diagram showing the relation between laser pulse interval and boron dose quantity based on the result of SIMS.

FIG. 3 shows the relation between the laser pulse interval and the dose (introduction and mixing) quantity of boron based on a calculation of a secondary ion mass spectrometry (SIMS). As shown in FIG. 3, the boron dose quantity increases in proportion to the laser pulse interval. It can be presumed that the quantity of boron that is dosed into a silicon after being adsorbed on the silicon surface increases in proportion to the laser pulse interval. Further, judging from that the measurement points in FIG. 3 are on an approximate straight line, it has been found that accurate control of the doping quantity of impurity elements into a polysilicon layer can be achieved by controlling the laser pulse interval.

Based on the above presumption, in order to dose impurity elements to a semiconductor film at a desired concentration, it is presumed necessary to control only the following parameters.

1) The quantity of impurity elements that are adsorbed before laser irradiation;
2) the adsorption rate of impurity elements when the surface of a semiconductor film is activated;
3) the time period from the start of laser pulse irradiation until the end of irradiation;
4) the quantity of impurity elements that collide to the surface of a semiconductor film per unit time; and
5) the chamber pressure (total pressure).

Among the above parameters, 1) can be grasped by the intercept of the Y-axis in FIG. 3. The parameters 2) to 4) can be grasped by the slope of the line in FIG. 3.

After all, the quantity of impurity elements to be adsorbed to the surface of a semiconductor film is determined based on the following equation: (the quantity of impurity elements to be adsorbed to the surface of a semiconductor film)=(the adsorption rate of the impurity elements when the surface of a semiconductor film is activated)×(the time of laser supply)×(the collision quantity of impurity elements per unit time)+(the quantity of the impurity elements to be adsorbed before supplying a laser beam). That is, since the quantity of impurity elements to be adsorbed corresponds to the quantity of impurity elements to be supplied, it is only necessary to determine an appropriate quantity of impurity elements and the supply quantity of molecules containing the calculated quantity of impurity elements based on the above equation.

In addition, in order to make the equation hold true, the molecules in the chamber need to have a large mean free path and show no properties as a continuum fluid. If the molecules show any property as a continuum fluid, the collision of elements evenly to all over a substrate becomes difficult due to the flow of a gas, which is expected to cause a variation in dose quantity within a substrate. As the chamber pressure listed as 5) above, 100 Pa or less is preferable. Further, it is preferable to set the substrate-heating temperature in the laser irradiation chamber to 350° C. or lower. This is because the Si—H bond on a silicon surface is cut off at a temperature over 350° C. and the silicon surface becomes always activated.

Thus, with the second embodiment, it has become possible to provide a low-cost and easy method for manufacturing a semiconductor device that can prevent the mixing of impurity elements by avoiding exposure to the atmosphere and, at the same time, control the variation in flat-band voltage.

Especially, with the second aspect of the invention, it has become possible to perform the crystallization of the semiconductor film 202, the doping of impurity elements, and the activation of doped impurity elements all at a time in the laser crystallization step, which further makes it possible to omit manufacturing devices such as a doping device, etc.

FIRST EXAMPLE

Next, a first example according to the first embodiment will be described. Again, the cross section of the manufacturing process of a thin-film transistor in FIG. 1 is referred to.

In the manufacturing step of the semiconductor film 102 (FIG. 1A), the substrate protective film 101 is formed on the substrate 100. As an example of the substrate 100, a general-purpose non-alkali glass substrate having a square shape of 300 mm×300 mm is used. In the first example, a silicon oxide film serving as the substrate protective film 101 is deposited by approximately 500 nm at a substrate temperature of 430° C. and by means of parallel plate plasma CVD.

Next in the first step (semiconductor film formation) (FIG. 1A), the semiconductor film 102, which is made of an intrinsic silicon film, etc. and to become an active layer of a thin-film transistor, is deposited. In the first example, the semiconductor film 102 is deposited in continuation from the deposition of the substrate protective film 101 in the same chamber by means of parallel plate plasma CVD. After depositing the substrate protective film 101, the atmosphere in the chamber is replaced with Ar by repeating vacuuming and Ar sealing twice, and the gas such as $O_2$, etc. used for forming the substrate protective film is exhausted from the chamber. Then, by supplying 100 sccm of silane ($SiH_4$), which is a raw material gas, and performing deposition at a deposition temperature of 430° C. for 60 seconds, the semiconductor film 102 as an amorphous silicon film is deposited by approximately 50 nm.

Next in the second step (dehydrogenation) (FIG. 1B), the substrate 100 is carried to a dehydrogenation chamber under a vacuum state (decompressed environment) and heated at 490° C. for 10 minutes so as to remove hydrogen. Thus, hydrogen on and within the semiconductor film 102 is released to reduce the hydrogen content down to approximately 1 atm. %, which enables laser crystallization.

Next in the third step (adsorption and termination of impurity elements) (FIG. 1C), the substrate 100 is carried from the dehydrogenation chamber to a laser irradiation chamber under a vacuum state (decompressed environment). In the laser irradiation chamber, 500 sccm of hydrogen and 5 sccm of diborane are supplied with the degree of vacuum set to, for example, 100 Pa. The heater in the laser irradiation chamber is maintained at, for example, a temperature 300° C. or lower, which does not cut off the Si—H bond on the silicon surface. With the above processing, boron is adsorbed to the silicon surface of the semiconductor film 102 at a concentration of approximately $1×10^{11}$ $cm^{-2}$.

Next in the fourth step (laser crystallization) (FIG. 1D), the polycrystallization of the semiconductor film 102 and the doping of boron to the semiconductor film 102 are concurrently performed by irradiating a laser after exhausting the diborane gas from the laser irradiation chamber.

SECOND EXAMPLE

Now, a second example according to the second embodiment will be described. Again, the cross section of the manufacturing process of a thin-film transistor in FIG. 2 is referred to.

In the manufacturing step of the semiconductor film 202 (FIG. 2A), the substrate protective film 201 is formed on the substrate 200. As an example of the substrate 200, a general-purpose non-alkali glass substrate having a square shape of 300 mm×300 mm is used. In the second example, a silicon oxide film serving as the substrate protective film 201 is deposited by approximately 500 nm at a substrate temperature of 430° C. and by means of parallel plate plasma CVD.

Next in the first step (semiconductor film formation) (FIG. 2A), the semiconductor film 202, which is made of an intrinsic silicon film, etc. and to become an active layer of a thin-film transistor, is deposited. In the second example, the semiconductor film 202 is deposited in continuation from the deposition of the substrate protective film 201 in the same chamber by means of parallel plate plasma CVD. After depositing the substrate protective film 201, the atmosphere in the chamber is replaced with Ar by repeating vacuuming and Ar sealing twice, and the gas such as $O_2$, etc. used for forming the substrate protective film 201 is exhausted from the chamber. Then, by supplying 100 sccm of silane ($SiH_4$), which is a raw material gas, and performing deposition at a deposition temperature of 430° C. for 60 seconds, the semiconductor film 202 as an amorphous silicon film is deposited by approximately 50 nm.

Next in the second step (dehydrogenation) (FIG. 2A), the substrate 200 is carried to a dehydrogenation (heating) chamber under a vacuum state (decompressed environment) and heated at 490° C. for 10 minutes so as to remove hydrogen. Thus, hydrogen on and within the semiconductor film 202 is released to reduce the hydrogen content down to approximately 1 atm. %, which enables laser crystallization.

Next in the third step (inactivation) (FIG. 2B), the substrate 200 is carried to a plasma processing chamber so as to inactivate the silicon surface by means of hydrogen plasma using hydrogen atoms. After the substrate 200 is carried to the plasma processing chamber, a hydrogen gas is introduced into the chamber. The gas flow rate is controlled to 1000 sccm by introducing a hydrogen gas of 99.999% from a mass flow controller. The pressure inside the plasma processing chamber is adjusted to 1 torr. After the gas pressure inside the plasma processing chamber is stabilized, RF discharge is started and the amorphous silicon surface is terminated using hydrogen. The temperature of the substrate is set to 350° C. and the power inputted for RF discharge is set to 0.05 $W/cm^2$. Judging from the generated active species, the surface of the amorphous silicon film is confirmed fully inactivated with a processing time of 10 seconds.

Next, the substrate 200 is carried from the plasma processing chamber to a laser irradiation chamber under a vacuum state (decompressed environment). In the laser irradiation chamber, the degree of vacuum is adjusted to 100 Pa while supplying 5000 sccm of hydrogen. Then, immediately before the silicon surface is crystallized by means of laser irradiation, 5 sccm of diborane gas is supplied. In the second example, an excimer laser (wavelength: 308 nm) of xenon chloride (XeCl) is irradiated. The half width of laser pulse intensity (half width with respect to time) is 25 ns. The area of laser irradiation is a line of 150 mm in length by 0.4 mm in width, and the energy density on the irradiated surface is 420 mJ/cm². When repeatedly irradiating the described laser beam, giving relative shifts with an overlap of 96.25% (that is, a shift of 15 μm for each irradiation), the number of times of laser pulse irradiation becomes approximately 20 times per region. An irradiation is performed at an irradiation frequency of 300 Hz. In this case, the transformation of the semiconductor film 202 from amorphous silicon to polycrystalline silicon; the doping of boron into the polycrystallized semiconductor film 203 at a concentration of approximately $2 \times 10^{16}$ cm$^{-3}$; and the activation of most of the atoms can be completed successfully. Further, since the temperature of the heater is set to 300° C. or lower, the cut-off of the Si—H bond on the silicon surface can be prevented.

In addition, the spaces for the semiconductor film deposition chamber; dehydrogenation chamber; plasma processing (termination) chamber; and laser irradiation chamber, which are separately provided in the second example, can be provided as the same single space.

THIRD EXAMPLE

Now, a third example of manufacturing method of a thin-film transistor that is a semiconductor device using a semiconductor film formed by the manufacturing method according to the first and second embodiments of the invention will be described with reference to FIG. 4.

Figures 4A, 4B:
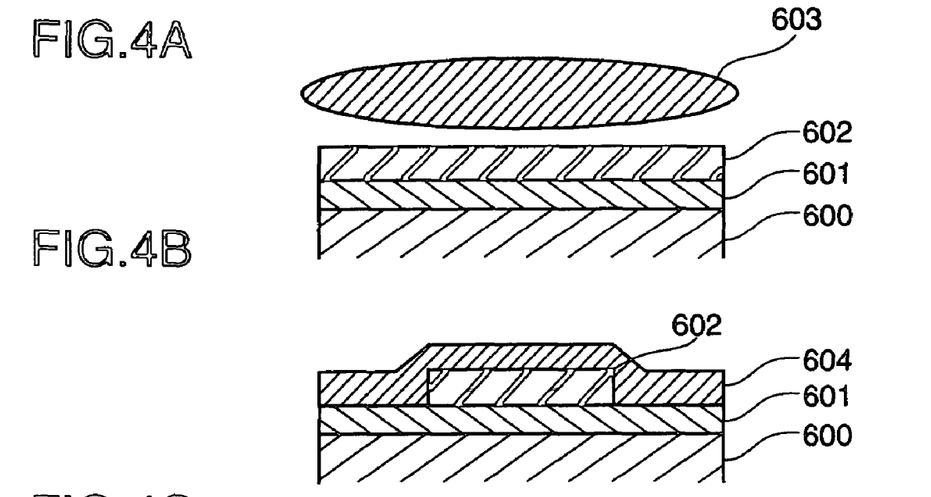
FIGS. 4A to 4E are flow charts showing the manufacturing process of a thin-film transistor according to a third example of the invention.

As shown in FIG. 4A, a substrate protective film 601 is formed on a substrate 600. Further on the substrate protective film 601, plasma processing is performed in order to terminate a large quantity of trapping levels introduced into a polycrystalline silicon layer 602 formed by the above manufacturing method. In the third example, oxygen plasma processing is performed in continuation from laser crystallization in the same processing chamber as for the plasma processing chamber, by avoiding exposure to the atmosphere. In the oxygen plasma processing, the substrate 600 is set in the plasma processing chamber and an oxygen gas is introduced into the same chamber. For example, an oxygen gas of 99.999% is introduced from a mass flow controller at a gas flow rate of 1000 sccm. The pressure inside the processing chamber is adjusted to 1 torr. After the gas pressure inside the chamber is stabilized, RF discharge is started and, by generating an oxygen plasma 603, the trapping levels in the polycrystallized silicon film is terminated. The temperature of the substrate is set to 350° C. and the power inputted for RF discharge is set to 0.15 W/cm². Judging from the generated active species, the inactivation of the trapping levels in the polycrystalline silicon layer can be achieved successfully to a sufficiently low concentration with a processing time of 600 seconds. In addition, the oxygen plasma processing can also be performed in a separate device, allowing a temporary exposure to the atmosphere. In this case, it is preferable to clean the substrate, before carrying the substrate into the device, with dilute hydrofluoric acid, etc., in order to remove a natural oxide film formed on the semiconductor film.

Next, as shown in FIG. 4B, etching is performed for the purpose of element isolation of the polycrystalline silicon layer 602, and then a gate insulation film 604 is deposited. For example, by introducing a silane gas and an oxygen gas into an insulation film deposition chamber at a flow rate ratio of 1:6, the pressure inside the deposition chamber is adjusted to $2 \times 10^{-3}$ torr. When the pressure inside the chamber is stabilized, ECR discharge is started to start the deposition of the insulation film. The power of a microwave inputted is 1 kW. The microwave is inputted in parallel to lines of magnetic force through an introduction window. There is an ECR point at a distance of 14 cm from the introduction window. Deposition is performed at a deposition speed of 100 nm/min. Thus, the gate insulation film 604 is deposited by 100 nm.

Figure 4C:
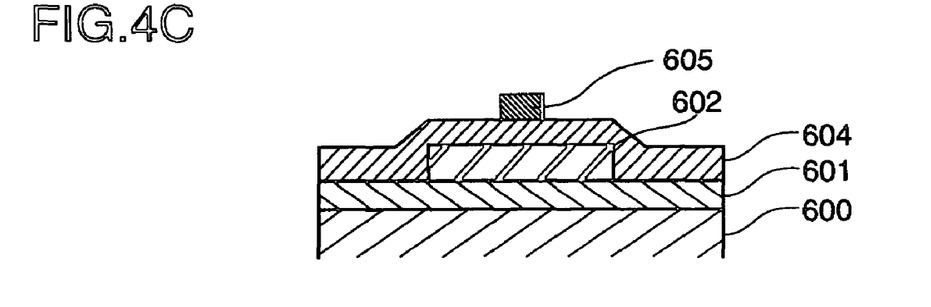

Next, as shown in FIG. 4C, a thin film serving as a gate electrode 605 is deposited by means of PVD or CVD. Since a gate electrode and gate wiring are usually made of the same material and in the same step, it is preferable that the material has a low electric resistance and is stable in a heating step performed at approximately 350° C. In the third example, a tantalum thin film having a thickness of 600 nm is deposited by means of sputtering. The substrate temperature for depositing the tantalum thin film is 180° C. As a sputtering gas, an argon gas containing a nitrogen gas by 6.7% is used. The tantalum thin film deposited as above has an α-crystal structure and a specific resistance of approximately 40 μΩcm. The thin film serving as a gate electrode is patterned after deposition, which is defined as a gate electrode 605.

Figure 4D:
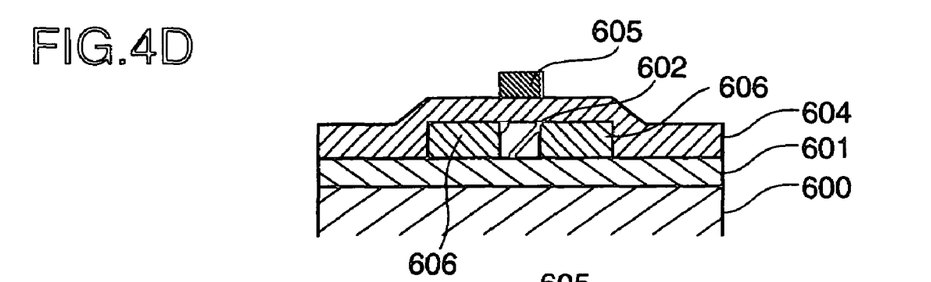

Next, as shown in FIG. 4D, a source-drain region 606 is formed by performing impurity ion implantation for the polycrystalline silicon layer 602. Since the gate electrode 605 serves as a mask in ion implantation, a channel 602 that is not subjected to ion implantation takes a self-alignment structure formed only under the gate electrode. As the raw material gas for ion doping, the hydride of the implanted impurities, such as phosphine (PH$_3$), diborane (B$_2$H$_6$), etc., that are diluted in hydrogen at a concentration of approximately 0.1% to 10% is used. In the third example, phosphine (PH$_3$) diluted in hydrogen at a concentration of 5% is implanted at an acceleration voltage of 100 keV for the purpose of forming NMOS, using an ion doping device. The total quantity of ion implantation including ions such as PH$_3^+$ and H$_2^+$ is $1 \times 10^{16}$ cm$^{-2}$.

Figure 4E:
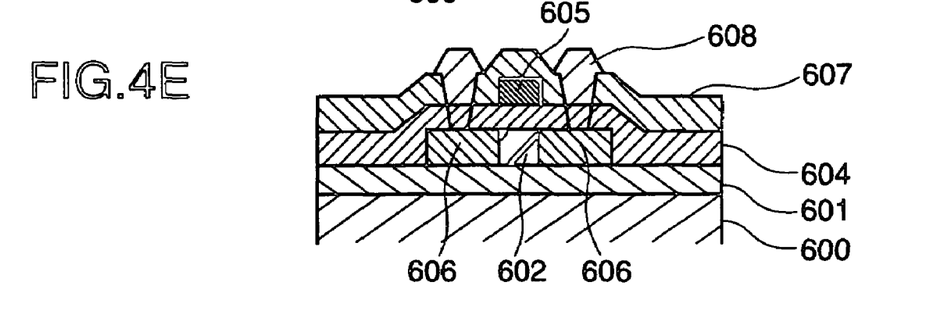

Next, as shown in FIG. 4E, by depositing an interlayer insulation film 607 on the gate insulation film 604 and the gate electrode 605; providing a contact hole on the source-drain region 606; and forming a source-drain take-out electrode 608 and wiring by means of PVD or sputtering, a thin film transistor is completed.

Thus, with the first and second embodiments of the invention, since a method for manufacturing a semiconductor device that can prevent the mixing of impurity elements by avoiding exposure to the atmosphere and, at the same time, control the variation in flat-band voltage can be achieved without using manufacturing devices such as a doping device, etc., semiconductor devices can be manufactured at a low cost and with ease.

What is claimed is:

1. A method for manufacturing a semiconductor device, comprising:
    forming a semiconductor film on a substrate;
    performing dehydrogenation for removing hydrogen from the semiconductor film;

performing a termination of a dangling bond of the semiconductor film with a supply of a molecule containing an impurity element to the semiconductor film while the molecule is accompanied by hydrogen; and crystallizing the semiconductor film;

wherein:

each of the forming a semiconductor film, performing the dehydrogenation, performing the termination of a dangling bond, and the crystallization of the semiconductor film being performed in an environment isolated from an atmosphere.

2. The method according to claim 1, wherein a doping of the impurity element to the semiconductor film is performed during a period in which the crystallizing of the semiconductor film is performed.

3. The method according to claim 1, wherein the molecule is diborane.

4. The method according to claim 1, wherein the performing of a termination of a dangling bond is performed in the presence of hydrogen plasma.

5. A method for manufacturing a semiconductor device, comprising:

forming a semiconductor film on a substrate;

performing dehydrogenation for removing hydrogen from the semiconductor film;

performing a termination of a dangling bond of the semiconductor film with a supply of a molecule containing an impurity element to the semiconductor film, a quantity of the supply is determined based on:

an adsorption rate of the impurity element when a surface of the semiconductor film is activated;

a time of supplying an energy for the termination of a dangling bond;

a quantity of collisions of the molecule per unit time; and a quantity of the impurity element that has been adsorbed before the supplying of the energy is performed; and crystallizing the semiconductor film;

wherein:

each of the forming a semiconductor film, performing the dehydrogenation, performing the termination of a dangling bond, and the crystallization of the semiconductor film being performed in an environment isolated from an atmosphere.

* * * * *